United States Patent
Kittler et al.

(10) Patent No.: US 9,147,998 B2
(45) Date of Patent: Sep. 29, 2015

(54) LIGHT-EMITTING SEMICONDUCTOR STRUCTURE AND OPTOELECTRONIC COMPONENT THEREFROM

(71) Applicant: IHP GmbH—Innovations for High Performance Microelectronics, Frankfurt (Oder) (DE)

(72) Inventors: Martin Kittler, Frankfurt (DE); Tzanimir Arguirov, Cottbus (DE); Manfred Reiche, Halle (DE)

(73) Assignee: IHP GMBH—INNOVATIONS FOR HIGH PERFORMANCE MICROELECTRONICS, Frankfurt (DE)

( * ) Notice: Subject to any disclaimer, the term of this patent is extended or adjusted under 35 U.S.C. 154(b) by 46 days.

(21) Appl. No.: 13/688,330

(22) Filed: Nov. 29, 2012

(65) Prior Publication Data
US 2013/0223464 A1    Aug. 29, 2013

(30) Foreign Application Priority Data

Nov. 29, 2011  (DE) .......................... 10 2011 087 369
Mar. 28, 2012  (DE) .......................... 10 2012 204 987

(51) Int. Cl.
| H01S 5/30 | (2006.01) |
| H01L 33/00 | (2010.01) |
| H01L 33/02 | (2010.01) |
| H01L 33/34 | (2010.01) |
| H01L 33/58 | (2010.01) |

(52) U.S. Cl.
CPC ............ *H01S 5/305* (2013.01); *H01L 33/0037* (2013.01); *H01L 33/025* (2013.01); *H01L 33/34* (2013.01); *H01L 33/0079* (2013.01); *H01L 33/58* (2013.01)

(58) Field of Classification Search
CPC .......................... H01L 33/0037; H01L 33/025
USPC .......................................................... 257/87
See application file for complete search history.

(56) References Cited

U.S. PATENT DOCUMENTS

| 5,438,210 A | 8/1995 | Worley | |
| 2005/0017257 A1* | 1/2005 | Green et al. | 257/98 |
| 2005/0070063 A1* | 3/2005 | Im et al. | 438/240 |

OTHER PUBLICATIONS

T. Hoang, et al; "The effect of Dislocation Loops on the Light Emission of Silicon LEDs;" Proceedings of ESSDERC, Grenoble, France; 2005; pp. 359-362.

(Continued)

*Primary Examiner* — Matthew W Such
*Assistant Examiner* — Robert Carpenter
(74) *Attorney, Agent, or Firm* — Ware, Fressola, Maguire & Barber LLP

(57) ABSTRACT

A light emitting semiconductor device according the invention includes an SOI substrate, a collector and an injector. The SOI substrate includes a carrier layer, a buried oxide layer on the carrier layer, and a doped silicon layer structure with a conductivity type. The doped silicon layer structure with the conductivity type includes at least two silicon- or silicon germanium layers arranged adjacent to one another, wherein a dislocation network is configured in their interface portions at which dislocation network a radiative charge carrier combination with a light energy is provided, which light energy is smaller than a band gap energy of the silicon- or silicon germanium layers. The collector is formed as a pn-junction in a portion between the dislocation network and a surface of the silicon layer structure that is oriented away from the carrier layer, and wherein the injector is configured as a metal insulator semiconductor diode.

19 Claims, 7 Drawing Sheets

(56) References Cited

OTHER PUBLICATIONS

Jiming Bao, et al; "Efficient Point Defect Engineered Si Light-emitting Diode at 1.218 um;" Proceedings of Conf. on Lasers and Electro-Optics 2007; May 6-11, 2007; pp. 1-2.

Martin Kittler, et al; "Dislocations as Active Components in Novel Silicon Devices;" Advanced Engineering Materials 2009; 11, No. 4; pp. 249-258.

M. Kittler, et al; "Regular Dislocation Networks in Silicon as a Tool for Novel Device Application;" ECS Transactions; The Electrochemical Society; 2006; pp. 429-450.

\* cited by examiner

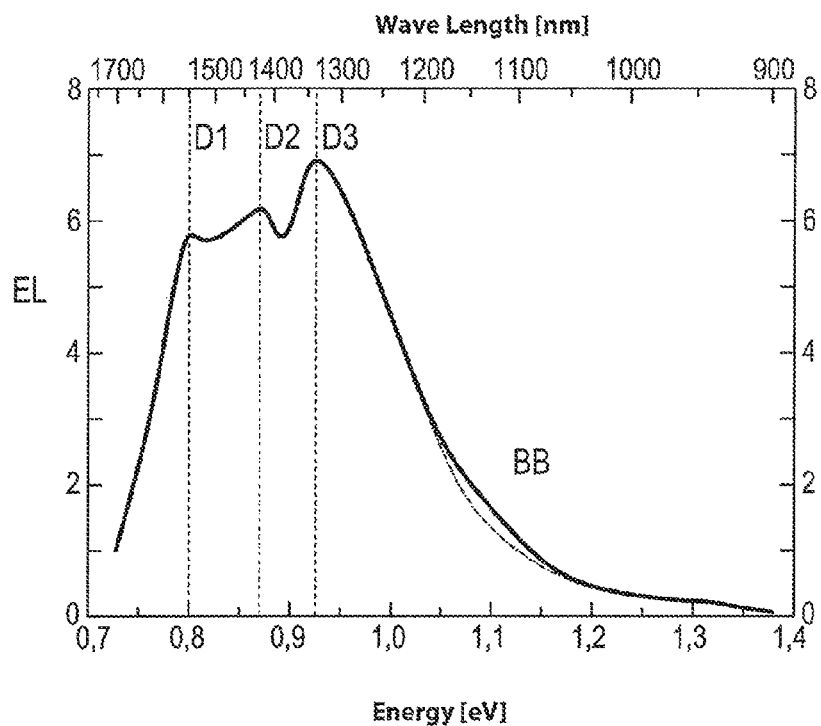
Fig. 1
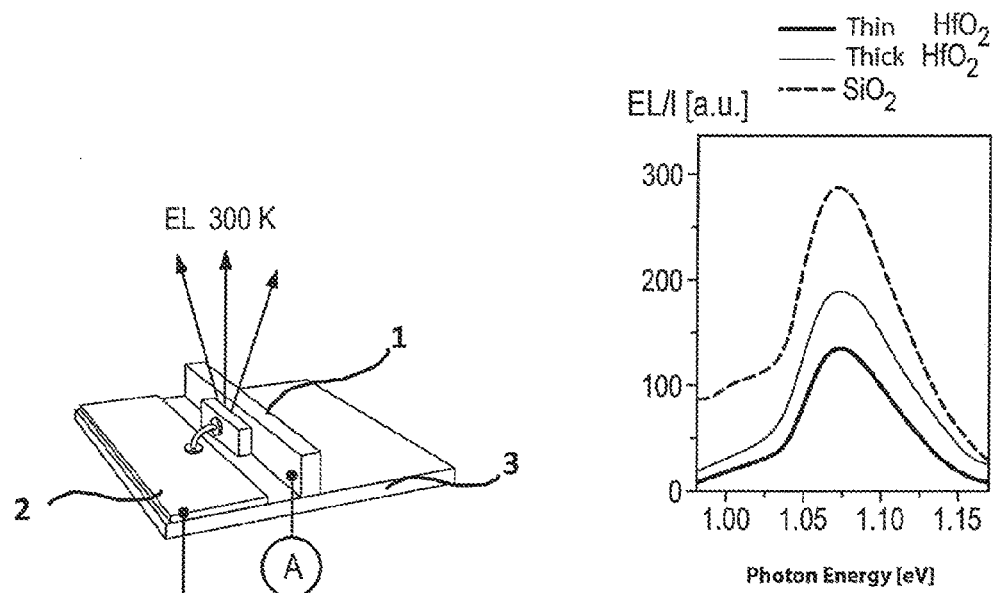
Fig. 2A
Fig. 2B

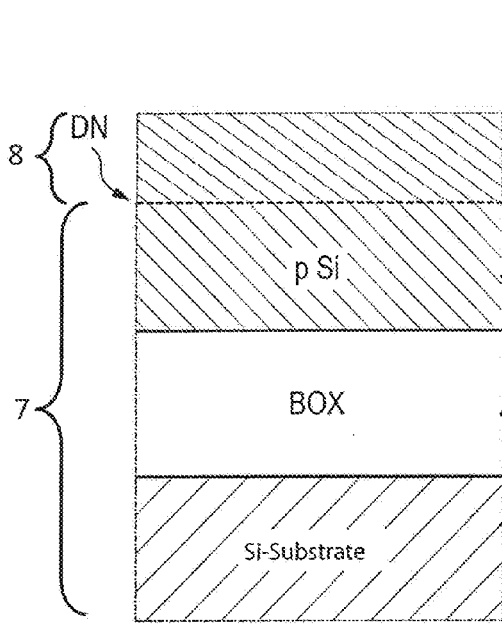
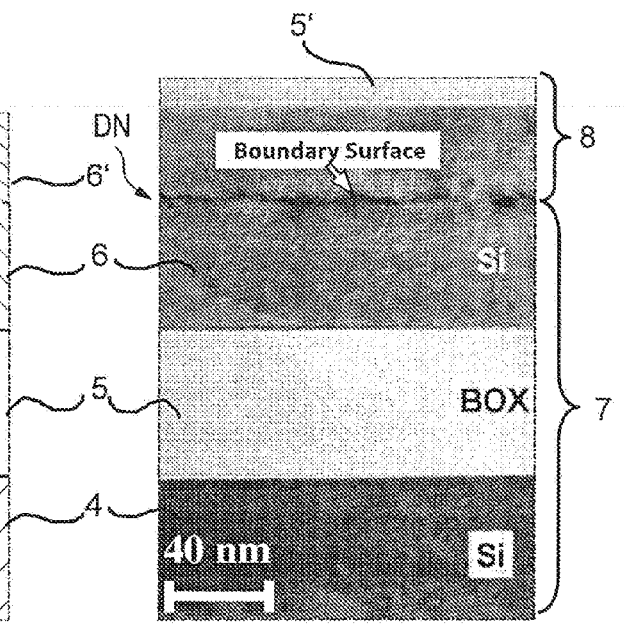
Fig. 4A  Fig. 4B
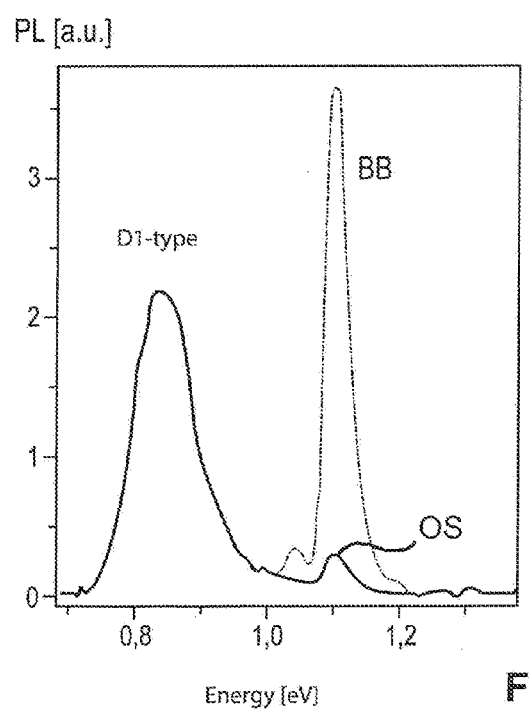
Fig. 4C

LIGHT-EMITTING SEMICONDUCTOR STRUCTURE AND OPTOELECTRONIC COMPONENT THEREFROM

CROSS REFERENCE TO RELATED APPLICATIONS

This application claims priority under 35 USC §119 to German Patent Application No. 10 2011 087 369.4 filed on Nov. 29, 2011 and German Patent Application No. 10 2012 204 987.8 filed on Mar. 28, 2012. Both applications are hereby incorporated by reference.

TECHNICAL FIELD

The invention relates to a light emitting semiconductor device and an optoelectronic device with the light emitting semiconductor device.

BACKGROUND OF THE INVENTION

The increasing use of optoelectronic devices in particular for message transmissions provides great challenges in the field of semiconductor research and technology when using the semiconductor material silicon, due to its indirect band gap. These challenges are even increased in that there is a need to join optoelectronic components with the current CMOS technology based on silicon. In order to avoid the disadvantages that are associated with wire connections like e.g. unacceptable delays or crosstalk or heating problems, efforts are being made to arrive at a monolithic integration of optical components on a semiconductor wafer (on chip).

For optoelectronic components of this type, known luminescent light emission bands in a spectral range of 1.3 to 1.55 µm that are associated with erbium doping, or dislocations, or dislocation networks are being used. A technological utilization of these infrared transitions in an optoelectronic device or a light emitting semiconductor structure requires particular process steps in order to increase the efficiency of a radiative recombination and to simultaneously be able to achieve control by circuitry.

SUMMARY OF THE INVENTION

Accordingly, it is an object of the present invention to provide a silicon structure in which a radiative recombination of charge carriers with a light energy below the forbidden zone of silicon can be made useful for an optoelectronic device.

In order to achieve this object, the invention proposes in a first aspect a light emitting semiconductor device, including
an SOI substrate including
a carrier layer,
a buried oxide layer on the carrier layer, and
a doped silicon layer structure of a conductivity type, including at least two silicon or silicon germanium layers arranged adjacent to one another, wherein a dislocation network is formed in their interface portions, at which dislocation network, when minority charge carriers are injected, a radiative charge carrier recombination with a light energy occurs, which is smaller than a band gap energy of the silicon- or silicon germanium layers, and
a collector and an injector laterally offset from the collector, wherein the collector is formed as a pn-junction in the portion between the dislocation network and a surface of the silicon layer structure that is oriented away from the carrier layer, and the injector is configured as a metal-insulator-semiconductor diode, subsequently designated as MIS diode, and wherein the dislocation network extends in lateral direction between the injector and the collector.

In the semiconductor device according to the invention, minority charge carriers can be introduced during operations through the injector into the silicon into a portion below the contact that is permeated by the dislocation network. These minority charge carriers then recombine radiatively with majority charge carriers that are located in the portion of the dislocations of the dislocation network. Thus, light is emitted with an energy which is smaller than the forbidden zone of silicon, which is accordingly not reabsorbed by the silicon. According to the invention, the charge carriers are attracted by the collector, wherein they drift laterally along the dislocation network. According to the invention, the injector brings minority charge carriers through an injector-collector system onto the dislocation network decorated with majority charge carriers, and the minority charge carriers are transported along the network to the collector. On the path along the dislocation network, the radiative recombination of the charge carriers then occurs.

In a second aspect, the invention provides an optoelectronic device for achieving the object, wherein the optoelectronic device includes a waveguide structure that is formed on an SOI substrate and a light emitting semiconductor device that is integrated into the waveguide structure.

It is an advantage of the invention that it can use a luminescence that is favorable for transmissions in glass fiber systems at a wavelength of approximately 1.5 µm or approximately 1.3 µm at ambient temperature while being integrated with typical devices that are produced through a CMOS technology.

In one embodiment, the insulator layer of the metal insulator diode (MIS) is formed from hafnium oxide ($HfO_2$). Preferably, the semiconductor layer of the MIS diode is the silicon layer proximal to the surface of the silicon layer structure, and the insulator layer of the MIS diode includes a silicon oxide layer that is arranged directly on the silicon layer and a hafnium oxide layer. Alternatively, the injector can also be configured as metal-oxide-semiconductor contact (MOS) which, however, is not preferred.

Another embodiment of the light emitting semiconductor device is characterized in that a doping profile extending throughout the silicon layer structure and a semiconductor layer of the MIS diode is configured so that minority charge carriers can be injected into the dislocation network by applying a suitable voltage to the injector.

The charge carriers at the injector can be injectable through voltage application in forward direction. The silicon layer structure can be produced according to the invention from two semiconductor wafers that are connected with one another through a bonding method. Thus, the two semiconductor wafers can be twisted by a respective angle relative to one another and/or tilted relative to one another.

The light emitting semiconductor device according to the invention is completely compatible with CMOS and SOI technologies and delivers exceptionally strong dislocation luminescence. Since light emitter structures of this type can be configured in thin SOI layers, their integration into SOI-based waveguides is feasible with great advantage.

According to the invention, the silicon layer structure has a thickness between 30 and 80 nm, in particular 40 nm.

The dislocation network that causes the radiative emission can be generated according to the invention by different processes. Thus it can be generated by an implantation of ions through the surface of the at least one semiconductor material. It is also conceivable to produce the dislocation network through plastic deformation of the at least one semiconductor material.

Preferably the semiconductor structure is produced from two silicon wafers connected with one another through a bonding method, wherein one silicon wafer includes an oxide layer. Thus, an SOI layer (silicon on insulator) is formed according to the invention. The two silicon wafers are thus twisted relative to one another and/or tilted relative to one another by an angle. According to the invention, the silicon is produced by a surface material removal from the semiconductor wafer that is oriented away from the substrate. The material removal from the silicon surface can be provided through the wet or dry chemical or mechanical surface removal techniques that are typical in semiconductor processing technology.

Particularly advantageously the dislocation network that is used for the radiative recombination is used in the bonding portion of the two silicon wafers.

Depending on the way the dislocations are generated, the dislocation network can include steps and/or screw dislocations. Here, it has become apparent according to the invention that screw dislocations favor dislocation luminescence. In particular, the intensity of the electricolumnescence depends on a distance or a density of the dislocations.

In another embodiment the light emitting semiconductor device includes an injector and collector that are buried relative to the surface that is oriented away from the carrier layer, wherein the collector and the injector are respectively electrically controllable through a contact section introduced from the surface into the silicon layer structure.

According to the invention at least one of the contacting sections can be generatable through diffusion of a metal or through doping. It is also conceivable that at least one of the contact sections is generatable through implantation of a metal or a doping material.

In one embodiment of the optoelectronic device according to the invention the waveguide is coupled in the portion of the injector and/or the collector below the surface. Advantageously, the waveguide can be coupled to the semiconductor device through a conical connector.

Advantageously the waveguide of the waveguide structure is furthermore configured as a ridge waveguide. The optoelectronic semiconductor device can also include coupler and resonator structures. The optoelectronic semiconductor device can be produced through a process that includes dry etching processes.

BRIEF DESCRIPTION OF THE DRAWINGS

The invention is subsequently described with reference to the enclosed drawing figures based on embodiments that are drawn in different scales and partially highly simplified. Like features are designated with like numerals in the drawing figures, wherein FIG. 1 is an illustration of the luminescence used for the invention;

FIGS. 2A-2B are illustrations of the principle for the light emission according to the invention at T=300 K;

FIG. 4A is a schematic illustration of an embodiment of a semiconductor structure fabricated from a layer structure shown in FIG. 4B;

FIG. 4B is an electron micrograph of the layer structure of FIG. 4A before removal of a surface silicon dioxide layer;

FIG. 4C is a luminescence spectrum of the embodiment according to FIG. 4A and FIG. 4B at T=80K;

DETAILED DESCRIPTION

A semiconductor structure according to the invention uses a spectral range designated with D1-D3 of an electro luminescence spectrum illustrated in FIG. 1 and generated at ambient temperature. It is apparent from FIG. 1 that the emission bands generated at dislocations or dislocation networks and generated through radiative charge carrier combination are significantly increased in intensity in a spectral range of 1300 to 1550 nm at ambient temperature (RT) relative to the radiative recombination process performed by band-band transitions and thus in the portion of the energy gap of silicon. The electro luminescence spectrum illustrated in FIG. 1 is achieved in an arrangement that is illustrated in a simplified manner in FIG. 2 in that non-equilibrium charge carriers are generated by applying an electrical voltage between two contacts 1, 2 that are arranged on a semiconductor material 3, wherein the non-equilibrium charge carriers recombine with one another in a radiative manner, emitting luminescence for generating an equilibrium. In case such electro luminescence is excited in a pure silicon crystal in which no faults are provided that introduce electronic levels into the band gap, the luminescence is provided in a band edge portion of the silicon.

Figure 3:
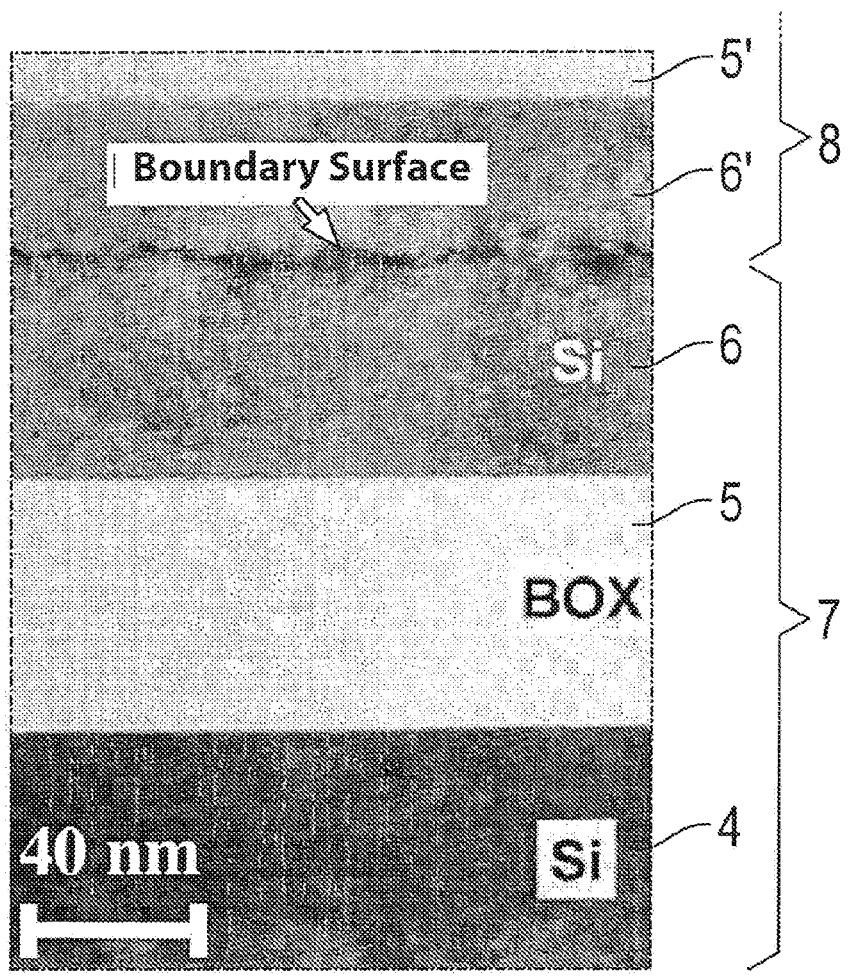
FIG. 3 shows an electron-microscopic partial cross-section through a silicon structure according to the invention.

According to the invention an electroluminescence is excited at a silicon layer structure whose configuration is illustrated in FIG. 3. On a silicon on insulator (SOI) substrate which includes a silicon substrate 4, a silicon oxide 5 deposited thereon or formed through natural oxidation and another silicon material 6 enclosing the silicon oxide on a side oriented away from the substrate 4. The oxide buried by the silicon substrate 4 and the silicon layer 6 is a buried oxide layer (BOX) well known in semiconductor technology. Another SOI structure 8 comprising a silicon material 6' and a silicon dioxide layer 5' has been applied in reverse sequence to the silicon layer 6 doped according to the invention to be hole conducting (p-type), through a silicon wafer bonding method.

Thus, the second SOI substrate 8 that is applied in reverse sequence is applied to the SOI substrate 7 so that the surfaces and thus the crystallographic orientations of the silicon wafers that are brought in contact with one another are rotated by an angle $\alpha$ and tilted by an angle $\beta$. These tilts or rotations, preferably in a range of $\alpha$, $\beta \leq 10°$, of the silicon crystals that are to be connected with one another lead to a formation of helix- and/or step dislocations which receive and compensate the grid misalignment at the joining surface of the two silicon crystals. The methods used for the invention are well known in semiconductor technology.

In the semiconductor device, the buried oxide layer 5' of the SOI structure 8 applied opposite to the SOI structure 7 is removed through typical wet and/or dry chemical methods forming a semiconductor structure that is schematically illustrated in FIG. 4A, wherein the silicon layer 6, 6' that is arranged above the hidden oxide layer 5 includes a dislocation network DN below the free surface. The luminescence lines (D1-like) illustrated in FIG. 4C are arranged at a depth of preferably 20 nm below the surface of the silicon layer 6. In the luminescence spectrum illustrated in FIG. 4C, a radiative transition can be observed adjacent to the D1-band which occurs at an energy of 1.1 eV. This spectral band designated in the figure with BB having a smaller half value width compared to the D1 band is a band-band luminescence of silicon. This narrower band BB is generated in the layers 6 and 4 according to the illustration in FIG. 4A.

Through a respective selection of an excitation laser wavelength, an excitation can be experimentally concentrated to the p-silicon layer 6 and is illustrated in FIG. 4C in the numerically computed band designated with the letters OS. Thus the absorption of the excitation light was computed in the layer 6 and 5 and in the substrate 4 and a separation of the luminescence into the portions 6 and 4 was performed. A separation of both components can be performed under the presumption that the band-band luminescence is proportional to the excitation density. Thus, the absorption of the excitation light was computed in the SOI layer and in the substrate in view of the multiple reflection in the structure. The spectrum of the radiation which only comes from the SOI-layer is illustrated in FIG. 4C through the line designated with the letters OS. It is apparent that the amount of luminescence caused by the dislocation at approximately 1.5 μm is many times higher than the band-band luminescence. For an electrical excitation through a MIS stack according to the invention, contrary to the optical excitation, no charge carriers are injected into the SI-substrate and the entire luminescence spectrum will mostly include D-dislocation bands.

Figure 5:
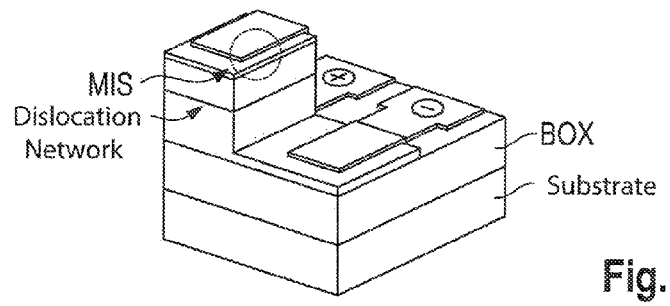
FIG. 5 shows a schematic illustration of a light emitting semiconductor device.

However, it has to be considered that the non-radiative recombination at the boundary surface between BOX (buried oxide) layer and SI-layer and at the surface of the SI-layer can substantially limit the efficiency of the light emitter. Therefore, designing a light emitting semiconductor device in SOI is a particular challenge. An optional embodiment of a MIS diode that is provided in the semiconductor device according to the invention, wherein the MIS diode uses a dislocation network inserted into SOI as an active portion for the 1.5 μm light emission is schematically illustrated in FIG. 5. Advantageously, the MIS structures provided according to the invention are produced through AVD-epitaxy. Thus, $HfO_2$ layers are deposited on defect-free silicon and contacted with a titanium contact.

In order to generate radiation, excess charge carriers are generated in the active portion, this means at the dislocation network. Two factors play an important role for this process. The first factor is the concentration of the excess minority charge carriers which is injected through the MIS structure. The MIS structure determines the amount of excess minority charge carriers which flow into the active portion of the emitter, this means to the network. The more minorities are provided in this portion, the stronger the luminescence. The second essential factor is the ability of the dislocation networks to receive minority charge carriers and thus to subsequently facilitate the intended radiative recombination. The injected minority charge carriers can generally recombine in several ways: a) in the thin SI-layer including the network and b) at the surface of the thin SI-layer and at the boundary surface between BOX and SI-layer which represents a particularly strong sink for the charge carriers. In order to obtain an efficient light emitting semiconductor structure it is therefore required to take precautions which facilitate that the minority charge carriers recombine at the dislocation network and which prevent that excess charge carriers get lost at the boundary surface or in the SI volume.

Figure 6:
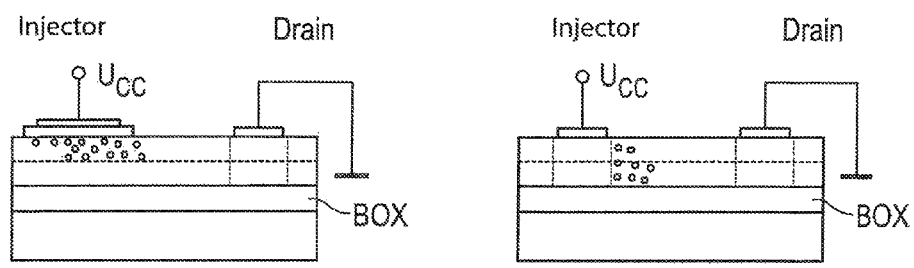
FIG. 6 is a schematic illustration of an injector and a collector according to the invention.

In order to be able to obtain a sufficient efficiency of the dislocation radiation from the SOI-layer two electrode arrangements were selected. The arrangement formed from injector and collector is used in order to obtain a direct electrical access to the dislocation network. The arrangement that is schematically illustrated in FIG. 6 can also include two pn-junctions.

The dislocation networks collect free charge carriers. Exactly this property is used in a controlled manner in the configuration illustrated in FIG. 6 in order to preferably direct the charge carriers to the dislocation network.

In order to contact the SOI based LED an injector arrangement is locally applied to the front side of the wafer. This arrangement is formed by a MIS structure. Another contact configured as a collector is required to let the superfluous charge carriers flow out. This contact is implemented through a pn-junction which is switched in reverse direction during operations. Through this second electrical contact, the excess charge carriers are "focused" and set in motion. Thus, the charge carriers impact radiative recombination centers and generate the dislocation specific D-luminescence including the D1-bands. It is to be expected that this minimizes the loss of charge carriers through recombination in the SI-volume and in particular at the surface/boundary surface. Thus, the efficiency of the light emitting semiconductor structure according to the invention is mostly limited by the ratio of the rates of non-radiative versus radiative recombination in the network. This ratio as well as the wavelength of the radiation is specific for the microscopic structure of the dislocation and is set through the bonding process.

Figure 7:
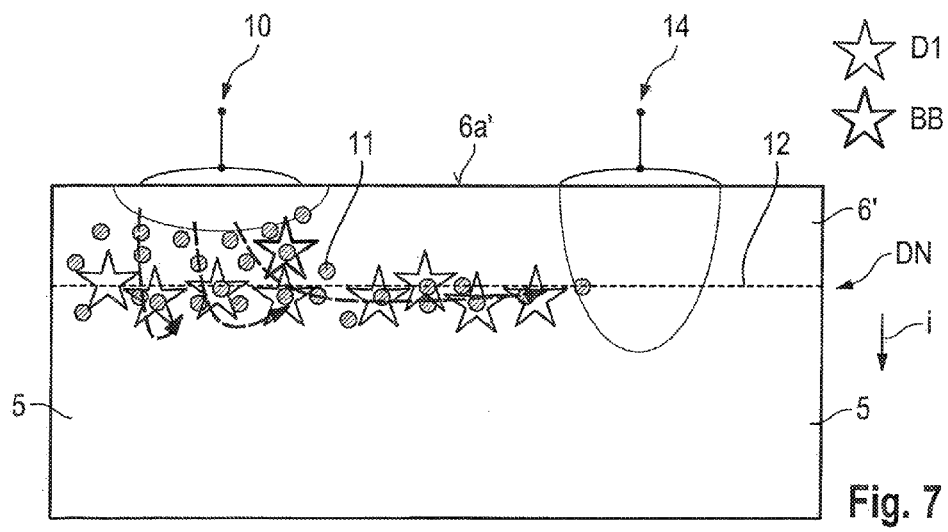
FIG. 7 is a simplified illustration of a charge carrier transport in the light emitting semiconductor device.

According to the invention, as schematically illustrated in FIG. 7, minority charge carriers 11 are injected through an injector configured as metal insulator semiconductor diode (MIS) into a p-doped semiconductor layer 6' (FIG. 3). Thus, according to the invention, a voltage loading of the injector 10 is provided so that an inversion layer required for injecting the minority charge carriers 11 reaches into a depth below the surface 6a' so that a dislocation network 12 that is arranged approximately 20 nm below the surface 6a' is reached by the minority charge carriers. A collector 14 configured as a pn-diode is provided at a lateral distance from the injector 10.

The pn-junction is generated according to the invention using masks through a local flat doping substance implantation followed by a brief thermal treatment (RTA). The doped areas were subsequently contacted in an electrical/Ohmic manner through vapor depositing aluminum. According to the invention, various structures of this type can be generated in order to assure their suitability for light emitters that can be integrated into the wave conductors.

The pn-junction of the collector 14 is thus switched in inverse direction so that a zone with a reduced number of charge carriers below the surface 6a' permeates the dislocation network 12 arranged parallel to the surface and extends beyond the dislocation network in a direction of the arrow i towards the interior of the silicon layer structure. By arranging the injector 10 and the collector 14 as illustrated in FIG. 7 a transportation of the minority charge carriers 11 in lateral direction is achieved. During this migration process of the excess minority charge carriers 11 along the dislocation network 12 which minority charge carriers were introduced by the injector 10 into the silicon structure, a recombination of the minority charge carriers with majority charge carriers bonded at the dislocations of the dislocation network 12 is facilitated which emits radiation. This recombination leads to a transmission of the emission bands D1-D3 illustrated in FIG. 1.

Figure 8:
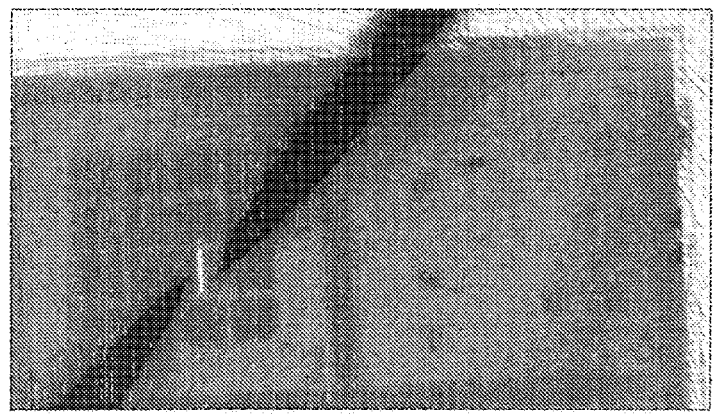
FIG. 8 shows an electro luminescence spectrum at a semiconductor device according to the invention.

FIG. 8 illustrates an electroluminescence signal at a silicon structure according to the invention obtained at room temperature. The electroluminescence signal illustrated herein as a vertical white emission light line is coupled according to the invention into a wave conductor of an optoelectronic semiconductor device. FIG. 9 in addition to an illustration according to FIG. 8 in which the electroluminescence is illustrated with background lighting (FIG. 9A) also illustrates the spectral dependency of the emission light (FIG. 9D).

FIG. 9 proves that it is possible to generate efficient dislocation luminescence at 300 K with an injector collector arrangement according to the invention in SOI layers with dislocation networks. In order to prove the luminescence, thus a newly developed micro electroluminescence system was used which facilitates infrared pictures of the luminescence from structures with sub-mm dimensions. Comparing the pictures with (FIG. 9B) and without band-band luminescence filter (FIG. 9C) proves that the radiation is primarily generated by luminescence at the dislocation network. No change of the brightness distribution is visible with filter and without filter. Even in the depiction with strong background lighting (FIG. 9A), the luminescent structure is clearly visible. When it is being considered that due to the large refractive index difference between SI and air, only less than 10% of the luminescence radiation is decoupled, this means in conclusion that the luminescence radiation that is generated is unusually strong and is estimated with an efficiency of several percent.

Figure 9A:
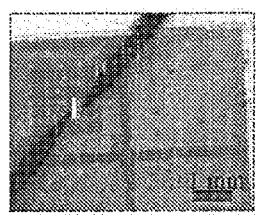
FIGS. 9A-9D show electro luminescence spectra at a semiconductor device according to the invention with respective spectral representation.
Figure 9B:
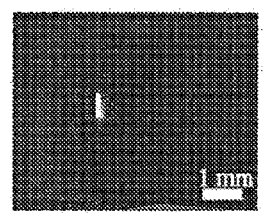
Figure 9C:
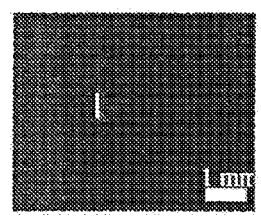
Figure 9D:
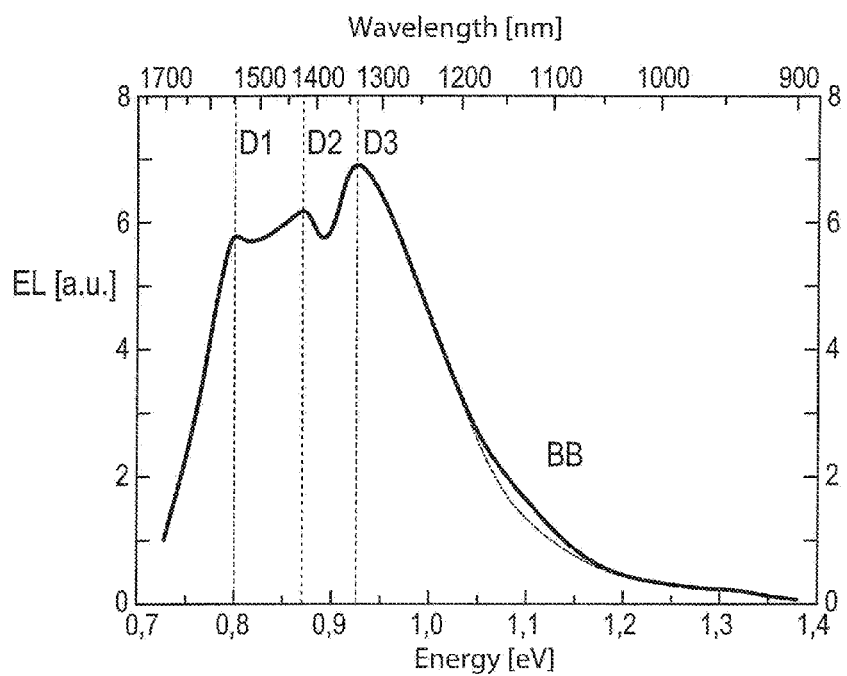
Figure 10:
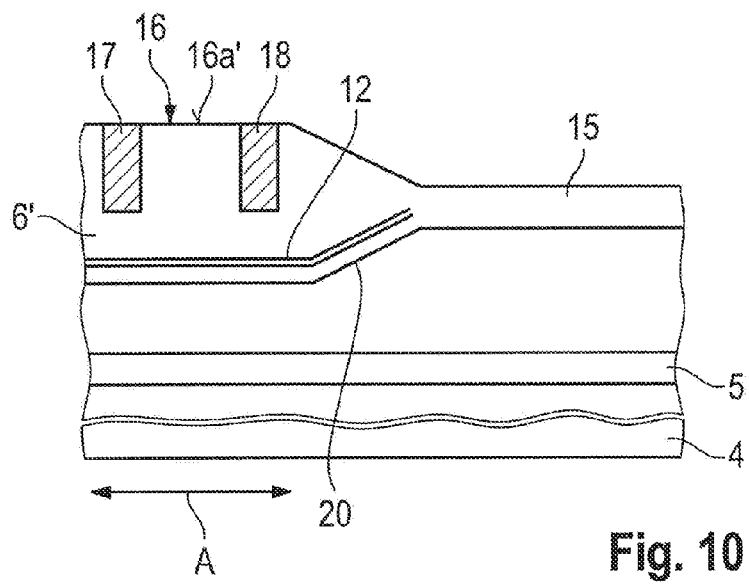
FIG. 10 shows a simplified illustration of an optoelectronic semiconductor device according to the invention.

The illustration of electroluminescence in FIG. 9C is depicted using an edge filter that filters out the luminescence of silicon that is proximal to the band edges. According to the invention this electroluminescence is not used at a surface of a semiconductor structure but the emission that is radiated in the interior of the semiconductor structure is efficiently introduced into a wave conductor of an optoelectronic device. For this purpose FIG. 10 illustrates an arrangement in which a wave conductor 15 is connected with a portion of a silicon structure that is schematically illustrated in the preceding figures and which is provided with an injector and a collector. According to the invention a silicon dislocation network 12 has thus been introduced through a bonding method described supra above a hidden oxide layer 5 that is arranged on the substrate 4. The injector-collector portion A which is provided with contacts on the outside and thus a light emitting semiconductor device according to the invention is arranged above the dislocation network in the image portion of FIG. 10.

In the light emitting semiconductor device 16, the injector and also the collector are introduced below the surface 16a so that a contact strip 17, 18 respectively formed from a metal is introduced from the surface 16a into the silicon 6'. Through respective electrical connections, minority charge carriers are injected into the silicon 6' through the injector that is not illustrated in more detail and which is configured as MIS diode, wherein the minority charge carriers are then attracted in lateral direction through a lock out circuit of the collector that is connected with the metal section 18 and not illustrated in detail either, wherein the minority charge carriers cause a radiative recombination along the dislocation network 12. The radiation generated by a recombination of the minority charge carriers with majority charge carriers bonded at the dislocations of the dislocation network 12 is optically coupled into the wave conductor 15 through a conical taper 20 of the silicon layer 6'. The emitted light is then conducted in a typical manner through the wave conductor 15 to additional optoelectronic devices that are not illustrated in the simple basic illustration in FIG. 10.

Figure 11:
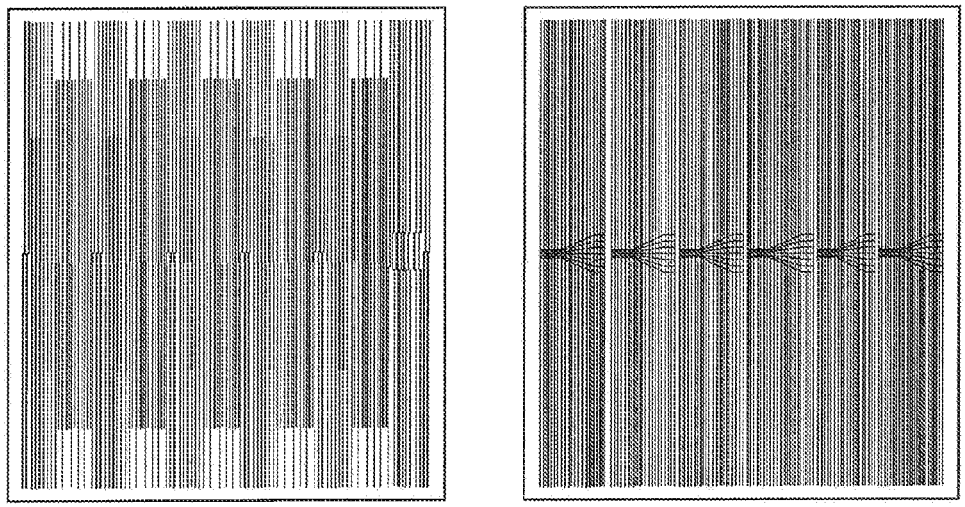
FIG. 11 shows layouts according to the invention for the waveguide structure according to the invention.
Figure 12:
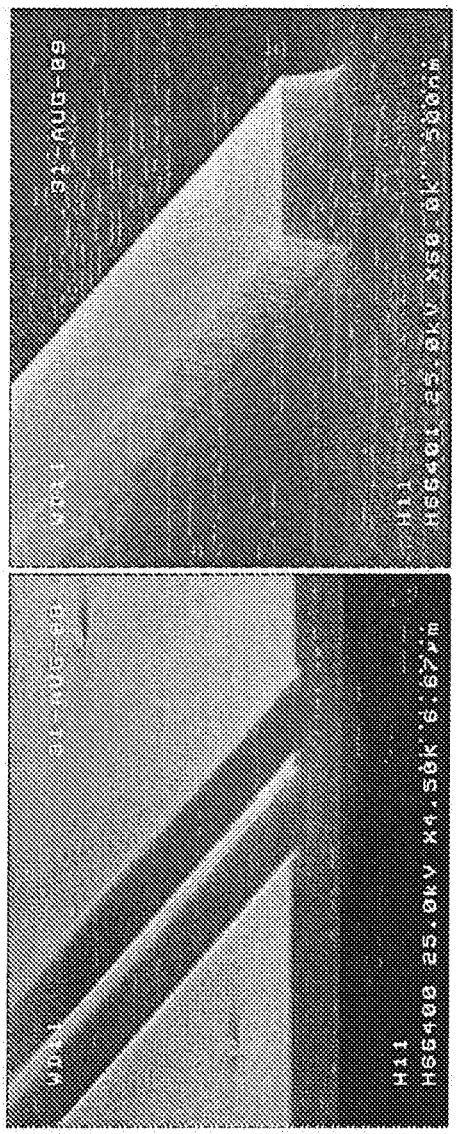
FIG. 12 shows nano waveguides according to the invention in an electron-microscopic illustration.

FIG. 11 illustrates layouts that are feasible within the scope of the invention for a wave conductor structure of the optoelectronic device. The wave conductors are thus integrated with the light emitting semiconductor device in BCMOS technology. For this embodiment gate modules with a 0.25 µm technology are being used. Thus, dry etching processes are being used as a process technology. Wave conductors that are used according to the invention are used in FIG. 12 based on a nano wave conductor illustrated after etching, carbonizing a photographic lacquer mask and removing a nitrite hard mask. It is appreciated in a context with the invention that also more complex structures which include coupling and resonator structures are integrated into the technology besides nano wave conductors and become part of the optoelectronic device according to the invention. Thus a reduction of the intrinsic wave conductor losses is paramount.

The invention claimed is:

1. A light emitting semiconductor device, comprising:
an SOI substrate including
a carrier layer,
a buried oxide layer on the carrier layer, and
a doped silicon layer structure of a conductivity type including at least two silicon- or silicon germanium layers arranged adjacent to one another, wherein a dislocation network is formed in their interface portions, at which dislocation network, when minority charge carriers are injected, a radiative charge carrier recombination with a light energy occurs, which light energy is smaller than a band gap energy of the silicon- or silicon germanium layers, and
a collector and an injector laterally offset from the collector, wherein the collector is formed as a pn-junction in a portion between the dislocation network and a surface of the silicon layer structure that is oriented away from the carrier layer, and wherein the injector is configured as a metal-insulator-semiconductor diode, subsequently designated as MIS diode.

2. The light emitting semiconductor device according to claim 1, wherein an insulator layer of the MIS diode is formed from hafnium oxide.

3. The light emitting semiconductor device according to claim 1,
wherein a semiconductor layer of the MIS diode is the silicon layer proximal to the surface of the silicon layer structure, and
wherein an insulator layer of the MIS diode includes a silicon oxide layer arranged on the silicon layer, and a hafnium oxide layer.

4. The light emitting semiconductor device according to claim 1, wherein the injector is configured as a metal-oxide-semiconductor structure.

5. The light emitting semiconductor device according to claim 1, wherein a doping profile extending throughout the silicon layer structure and a semiconductor layer of the MIS diode is configured so that minority charge carriers are injectable into the dislocation network by applying a suitable voltage to the injector.

6. The light emitting semiconductor device according to claim 5, wherein the charge carriers are injectable at the injector by a voltage application in forward direction.

7. The light emitting semiconductor device according to claim 1, wherein the silicon layer structure is made from two semiconductor wafers connected with one another through a bonding method.

8. The light emitting semiconductor device according to claim 7, wherein the two semiconductor wafers are twisted and/or tilted relative to one another by a respective angle.

9. The light emitting semiconductor device according to claim 1, wherein the silicon layer structure has a thickness of between 30 and 80 nm.

10. The light emitting semiconductor device according to claim 1, wherein the injector and the collector are buried relative to the surface of the silicon layer structure that is oriented away from the carrier layer, wherein the collector and the injector are respectively electrically controllable by a contact section that is introduced from the surface into the silicon layer structure.

11. The light emitting semiconductor device according to claim 10, wherein at least one of the contact sections is generatable by metal indiffusion.

12. The light emitting semiconductor device according to claim 10, wherein at least one of the contact sections is generatable by doping.

13. The light emitting semiconductor device according to claim 10, wherein at least one of the contact sections is generatable through implantation of a metal or a doping material.

14. The light emitting semiconductor device according to claim 9, wherein the silicon layer structure has a thickness of 40 nm.

15. An optoelectronic device comprising:
a waveguide structure which is configured on an SOI substrate; and
a light emitting semiconductor device according to claim 1 that is integrated into the waveguide structure.

16. The optoelectronic device according to claim 15, wherein the waveguide is coupled in the portion of the injector and/or of the collector below the surface that is oriented away from the carrier layer.

17. The optoelectronic device according to claim 15, wherein the waveguide is coupled to the semiconductor device through a connector that tapers in its vertical extension over a lateral distance.

18. The optoelectronic device according to claim 15, wherein the waveguide is configured as a ridge waveguide.

19. The optoelectronic device according to claim 15, including coupler- and resonator structures.

\* \* \* \* \*